United States Patent
Chan et al.

(10) Patent No.: US 9,899,220 B2
(45) Date of Patent: Feb. 20, 2018

(54) METHOD FOR PATTERNING A SUBSTRATE INVOLVING DIRECTED SELF-ASSEMBLY

(71) Applicants: IMEC VZW, Leuven (BE); KATHOLIEKE UNIVERSITEIT LEUVEN, KU LEUVEN R&D, Leuven (BE)

(72) Inventors: Boon Teik Chan, Leuven (BE); Zheng Tao, Leuven (BE); Arjun Singh, Leuven (BE); Jan Doise, Leuven (BE)

(73) Assignees: IMEC VZW, Leuven (BE); KATHOLIEKE UNIVERSITEIT LEUVEN, KU LEUVEN R&D, Leuven (BE)

(*) Notice: Subject to any disclaimer, the term of this patent is extended or adjusted under 35 U.S.C. 154(b) by 0 days.

(21) Appl. No.: 15/289,550

(22) Filed: Oct. 10, 2016

(65) Prior Publication Data
US 2017/0170017 A1   Jun. 15, 2017

(30) Foreign Application Priority Data
Dec. 15, 2015 (EP) .................................. 15200210

(51) Int. Cl.
*H01L 21/00* (2006.01)
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
None
See application file for complete search history.

(56) References Cited

U.S. PATENT DOCUMENTS 6,861,751 B2   3/2005   Tao
8,679,356 B2   3/2014   Kontos et al.
(Continued)

FOREIGN PATENT DOCUMENTS

JP   2015-115599 A   6/2015

OTHER PUBLICATIONS

Bekaert, J. et al., "N7 Logic Via Patterning Using Templated DSA: Implementation Aspects", Proc. SPIE 9658, Photomask Japan 2015: Photomask and Next-Generation Lithography Mask Technology XXII, Jul. 9, 2015, pp. 965804-1-965804-11.
(Continued)

*Primary Examiner* — Reema Patel
(74) *Attorney, Agent, or Firm* — McDonnell Boehnen Hulbert & Berghoff LLP

(57) ABSTRACT

A method for patterning a substrate is disclosed. The method includes applying a first directed self-assembly (DSA) patterning process that defines a first patterned layer on top of the substrate. The pattern of the first patterned layer is to be transferred into the substrate. The method also includes applying a planarizing layer on top of the first patterned layer. The method further includes applying a second DSA patterning process that defines a second patterned layer on top of the planarizing layer, thereby not patterning the planarizing layer. A pattern of the second patterned layer is to be transferred into the substrate. Projections of the pattern of the second patterned layer and the pattern of the first patterned layer on the substrate have no overlap. Additionally, the method includes transferring the patterns defined by the first patterned layer and the second patterned layer into the substrate.

12 Claims, 24 Drawing Sheets

(56) References Cited

U.S. PATENT DOCUMENTS

| | | | |
|---|---|---|---|
| 8,956,808 B2* | 2/2015 | Schmid | G03F 7/0002 |
| | | | 430/323 |
| 9,029,266 B2 | 5/2015 | Kasahara et al. | |
| 2013/0105437 A1* | 5/2013 | Albrecht | B82Y 10/00 |
| | | | 216/22 |
| 2014/0131839 A1 | 5/2014 | Chan et al. | |
| 2014/0273476 A1 | 9/2014 | Cheng et al. | |
| 2015/0024597 A1 | 1/2015 | Gao et al. | |
| 2015/0151329 A1 | 6/2015 | Kawanishi et al. | |
| 2016/0343588 A1* | 11/2016 | Somervell | G03F 7/0002 |

OTHER PUBLICATIONS

Seino, Yuriko et al., "Contact Hole Shrink Process Using Graphoepitaxial Directed Self-Assembly Lithography", Journal of Micro/Nanolithograhy, MEMS and MOEMS, vol. 12, No. 3, Jul.-Sep. 2013, pp. 033011-1-033011-6.

* cited by examiner

METHOD FOR PATTERNING A SUBSTRATE INVOLVING DIRECTED SELF-ASSEMBLY

CROSS-REFERENCE TO RELATED APPLICATIONS

The present application is a non-provisional patent application claiming priority to European Patent Application No. EP 15200210.1, filed Dec. 15, 2015, the contents of which are hereby incorporated by reference.

FIELD OF THE DISCLOSURE

The present disclosure relates to methods for patterning a substrate using directed self-assembly (DSA) techniques.

BACKGROUND

Directed Self Assembly (DSA) is a rapidly maturing technology for advanced patterning for semi-conductor applications. DSA is based on the self-assembling properties of block copolymer (BCP) materials. It offers a low-cost route to very dense and regular patterns. It is expected that DSA will need to be combined with traditional lithography techniques.

Several approaches for DSA have been proposed to define regular line/space patterns, line/space patterns with some irregular nature, regular hexagonal hole patterns, or more irregular and sparser hole patterns. DSA can thus be regarded as a "chemical resolution enhancement technique". Among all DSA morphologies, the cylindrical structures have attracted significant attention, due to the potential to achieve sub-20 nm contact holes on a sub-40 nm pitch, which exceeds the capability of any current single patterning lithography.

Specifically, in templated DSA, a grapho-epitaxy flow, a trench-like pre-pattern (or "template") is printed by conventional lithography. In this confined template, the BCP material allows a cylindrical phase separation which results in sub-resolution hole patterns. The configuration of holes within each template depends on the shape and size of the particular template and the BCP periodicity. Templated DSA is mainly considered for application in via mask levels. The technique has a relatively feasible path for implementation with existing design flows. It has the potential to replace a multiple patterning method in which multiple exposures per layer will be needed in expense of edge placement errors, increasing tool and production costs.

The most critical challenges that need to be understood and controlled include CD and pattern placement accuracy, low defectivity, and how to implement DSA as a patterning method.

In J. Bekaert, J. Doise, R. Gronheid, J. Ryckaert, G Vandenberghe, G Fenger, Y. J. Her, and Y. Cao, "N7 logic via patterning using templated DSA: implementation aspects", Proc. SPIE 9658, Photomask Japan 2015: Photomask and Next-Generation Lithography Mask Technology XXII, 965804 (Jul. 9, 2015); doi:10.1117/12.2196524, paragraph 4, a demonstration is disclosed of a double DSA patterning scheme.

For Logic N7 technology node and beyond, it is known that more than a single template DSA process is required in order to meet the complex high density and small pitch requirement. When double or multiple template pre-pattern trenches overlap each other to achieve small pitch, the next (e.g., 2nd) template DSA process can be influenced or jeopardized by any of the previous (e.g., 1st) template DSA contact holes. A similar problem can arise when performing pillar patterning. For instance, openings or pillar structures resulting from a first DSA process may appear in the pre-pattern trenches of the second DSA process, jeopardizing the success of the second DSA process.

There exists a need in industry for improved double or multiple DSA patterning processes.

SUMMARY

It is an aim of the present disclosure to provide a method for patterning a substrate by double or multiple DSA patterning.

This aim is achieved according to the disclosure with the method showing the technical characteristics of the first independent claim.

According to certain embodiments, a method for patterning a substrate is disclosed, comprising:

applying a first DSA patterning process defining a first patterned layer on top of the substrate, the pattern of the first patterned layer intended to be transferred into the substrate;

applying a planarizing layer on top of the first patterned layer;

applying a second DSA patterning process defining a second patterned layer on top of the planarizing layer, thereby not patterning the planarizing layer, the pattern of the second patterned layer intended to be transferred into the substrate, and the projections of the pattern of the second patterned layer and the pattern of the first patterned layer on the substrate having no overlap; and thereafter, transferring the patterns defined by the first patterned layer and the second patterned layer into the substrate.

Some embodiments allow the formation of different patterned layers, the patterns of which are formed by respective DSA template patterning processes, to be performed independently, without risking interference of a previous (e.g., first) patterning process on a subsequent (e.g., second) patterning process.

It will be appreciated how to define the patterned layers, i.e., how to implement the template DSA processes, such that no overlap exists in the projections of the pattern of a next (e.g., the second) patterned layer and the pattern of a previous (e.g., the first) patterned layer on the substrate. The considered projections are defined as the areas of the main surface of the substrate defined by the orthogonal projections of the respective patterned layers on the main surface of the substrate.

It will be appreciated further that not only two subsequent DSA template patterning steps can be performed, but that the method can in principle be repeated an integer number of times, thereby creating an integer number n patterned layers intended to be transferred into the substrate, which are finally transferred into the substrate. In such type of processes, the DSA template patterning processes are devised such that the projections of the n patterned layers (intended to be transferred into the substrate) on the substrate are having no overlap. In other words, for any pair of the n patterned layers intended to be transferred into the substrate, the projections of the two patterned layers on the substrate are not overlapping.

It is noted that in some embodiments, as described in more detail below, DSA template holes of respective DSA template patterning processes may be partially overlapping, as long as the projections of the final patterns intended for being transferred into the substrate do not overlap.

The planarizing layer can for instance comprise or consist of a spin-on carbon material or BARC (bottom anti-reflective coating) material.

According to some embodiments, the substrate comprises a hard mask layer (for instance an organic, inorganic or metal hard mask, for instance comprising TiN, $SiO_2$, $Si_3N_4$, provided by a low temperature atomic layer deposition, ALD, process) on top of a target substrate (e.g., silicon substrate or wafer).

According to a first type of embodiments, applying a first DSA patterning process comprises:

providing a first dielectric hard mask layer on the substrate, e.g., on the hard mask layer;

providing a first planarizing layer on the first dielectric hard mask layer;

providing a first patterned photoresist layer on the first planarizing layer, the first patterned photoresist layer comprising openings;

transferring the openings in the first patterned photoresist layer into the first planarizing layer, applying a first BCP material in openings defined in the patterned first planarizing layer;

inducing phase separation of the first BCP material in the openings in the patterned first planarizing layer, resulting in cylindrical domains of a first component of the first BCP material being surrounded by a complementary domain of a second component of the first BCP material;

selectively removing the first component thereby defining openings in the second component of the first BCP material in the openings in the patterned first planarizing layer;

transferring the openings in the second component of the first BCP material in the first dielectric hard mask layer, the latter corresponding to the first patterned layer;

selectively removing the first planarizing layer and the second component of the first BCP material.

According to some embodiments, applying a second DSA patterning process comprises:

providing a second dielectric hard mask layer on the planarizing layer;

providing a second planarizing layer on the second dielectric hard mask layer;

providing a second patterned photoresist layer on the second planarizing layer, the second patterned photoresist layer comprising openings;

transferring the openings in the second patterned photoresist layer into the second planarizing layer, applying a second BCP material in openings defined in the patterned second planarizing layer;

inducing phase separation of the second BCP material in the openings in the patterned second planarizing layer, resulting in cylindrical domains of a first component of the BCP material being surrounded by a complementary domain of a second component of the second BCP material;

selectively removing the first component thereby defining openings in the second component of the second BCP material in the openings in the patterned second planarizing layer;

transferring the openings in the second component of the second BCP material in the second dielectric hard mask layer, the latter corresponding to the second patterned layer;

selectively removing the second planarizing layer and the second component of the second BCP material.

According to some embodiments, the method further comprises transferring the openings in the second dielectric hard mask layer into the first dielectric hard mask layer, followed by transferring the resulting pattern of the patterned first dielectric hard mask layer into the substrate.

According to some embodiments of a second type, applying a first DSA patterning process comprises:

providing a first dielectric hard mask layer on the substrate, e.g., on the hard mask layer;

providing a first planarizing layer on the first dielectric hard mask layer;

providing a first patterned photoresist layer on the first planarizing layer, the first patterned photoresist layer comprising openings;

transferring the opening in the first patterned photoresist layer into the first planarizing layer, applying a first BCP material in openings defined in the patterned first planarizing layer;

inducing phase separation of the first BCP material in the openings in the patterned first planarizing layer, resulting in cylindrical domains of a first component of the first BCP material being surrounded by a complementary domain of a second component of the first BCP material;

performing a sequential infiltration synthesis process to selectively transform the cylindrical domains of the first component into first metallic pillar structures;

selectively removing the second component and the first planarizing layer, the pattern of first metallic pillar structures corresponding to the first patterned layer.

According to some embodiments, applying a second DSA patterning process comprises:

providing a second dielectric hard mask layer (e.g., ALD AlN metal hard mask) on the planarizing layer;

providing a second planarizing layer on the dielectric hard mask layer;

providing a second patterned photoresist layer on the planarizing layer, the second patterned photoresist layer comprising openings;

transferring the openings in the second patterned photoresist layer into the second planarizing layer, applying a second BCP material in openings defined in the patterned second planarizing layer;

inducing phase separation of the second BCP material in the openings in the patterned second planarizing layer, resulting in cylindrical domains of a first component of the second BCP material being surrounded by a complementary domain of a second component of the second BCP material;

performing a sequential infiltration synthesis process to selectively transform the cylindrical domains of the first component into second metallic pillar structures;

selectively removing the second component and the planarizing layer; the pattern of metallic pillar structures defining a second patterned layer on top of the planarizing layer.

According to some embodiments, the method further comprises transferring the pattern of second metallic pillar structures into the second dielectric hard mask layer and into the planarizing layer, and transferring the patterns of first metallic structures and the patterned planarizing layer into the first dielectric hard mask layer.

According to some embodiments, the method further comprises removing the metallic pillar structures and the planarizing layer, followed by transferring the pattern of the patterned first dielectric hard mask layer into the substrate.

Any of the BCP layers described above can be for instance comprise or consist of a (Polystyrene)-b-PMMA (poly methyl methacrylate) (PS-b-PMMA) material. The BCP layer can for instance comprise or consist of so called high-chi block copolymers (which have a higher chi-parameter as the already mentioned PS-b-PMMA system). Examples include silicon-containing block copolymers

[polystyrene-block-polydimethylsiloxane (PS-b-PDMS), PMOST-b-PTMSS a.o.], polystyrene-block-poly-2-vinylpyridine, etc.

Any of the planarizing layers can for instance comprise or consist of a spin-on carbon material or BARC material. Any of the planarizing layers for instance can comprise a bilayer structure comprising a spin on carbon layer and a spin-on glass layer on top of the spin-on carbon layer.

Any of the dielectric hard mask layers can, for instance, be or comprise a SiN layer (such as a $Si_3N_4$ layer), $SiO_2$ layer, TiN layer, AlN layer etc., deposited at low temperature by way of an ALD process.

Photoresists layers are known to the skilled person.

Sequential infiltration synthesis (SIS) processes are known to the skilled person. For instance, AlOx structures can be formed. In SIS, organometallic (OM) precursor vapors and oxidants are sequentially introduced into self-assembled block copolymer systems in multiple cycles. The OM precursor is chosen to ensure selective reaction with only one of the copolymer blocks in the BCP. The unmodified BCP block is subsequently etched away. Thus, the polymer pattern is transformed into a metallic mask with much enhanced plasma etch contrast Certain objects of various aspects have been described herein above. It is understood that this summary is merely an example and is not intended to limit the scope of the disclosure. The disclosure, both as to organization and method of operation, together with features thereof, may best be understood by reference to the following detailed description when read in conjunction with the accompanying drawings.

BRIEF DESCRIPTION OF THE FIGURES

The disclosure will be further elucidated by way of the following description and the appended figures.

DETAILED DESCRIPTION

Figure 1:
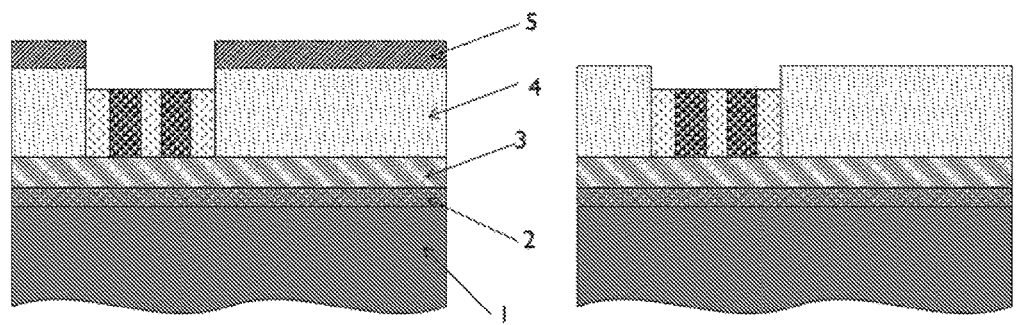
FIG. 1 illustrates a DSA process in which a BCP material is used.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, are to be construed as example manners in which the disclosure may be implemented rather than as limiting the scope of the disclosure.

FIG. 1 illustrates a template DSA process. On a target substrate 1, a hard mask layer 2 is provided. A dielectric hard mask layer 3 is provided on top thereof. Then, for instance a spin-on carbon (SoC) layer and a spin-on Glass (SoG) layer can be provided as a planarizing layer 4,5. A trench is etched in the planarizing layer, defining a template hole which has dimensions corresponding to a predetermined Block copolymer layer comprising a BCP material to be applied in the hole. The dimensions of the template hole are chosen in function of the characteristics, e.g., of the natural periodicity, of the BCP layer (L0). The template holes may be formed by photolithography. Phase separation of the BCP material is induced, resulting in regularly spaced cylindrical regions of a first polymer component defining pillars, which are surrounded by the second polymer component of the BCP material. The cylindrical regions are removed, and the resulting region defined by the second component is used in order to transfer the pattern of holes into the dielectric hard mask layer 3. It is noted that the template DSA process can be performed with or without the presence of the SoG layer 5 (also the case for embodiments described below).

Figure 2:
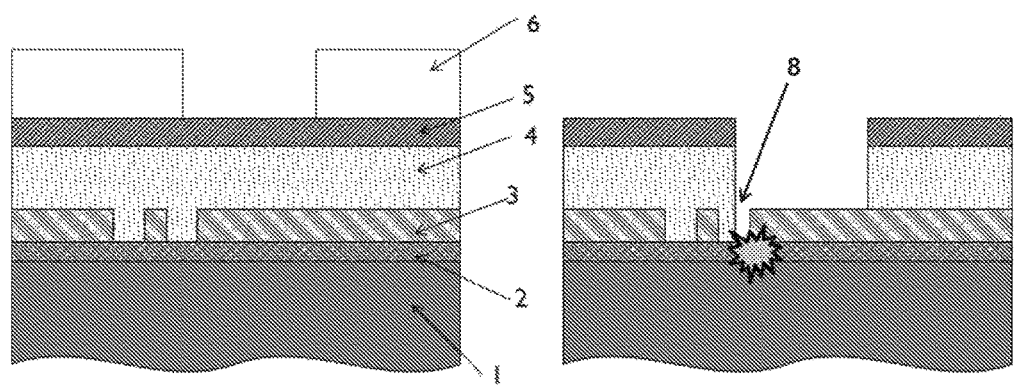
FIG. 2 illustrates a problem occurring when performing double DSA patterning.

FIG. 2 illustrates a problem occurring if a straight forward double patterning process would be applied based on the process of FIG. 1, which becomes more important for smaller critical dimensions to be achieved. Indeed, if in a straightforward manner a further planarizing layer 4,5 would be applied on the patterned dielectric hard mask layer 3, and patterned by applying a patterned photoresist layer 6 and transferring the photoresist pattern in the planarizing layer, the respective template holes may overlap with the previously defined pattern of the dielectric hard mask layer 3. Previously defined holes 8 in the dielectric hard mask layer 3 may be exposed, and may jeopardize the BCP filling process and/or phase separation process.

Figure 3:
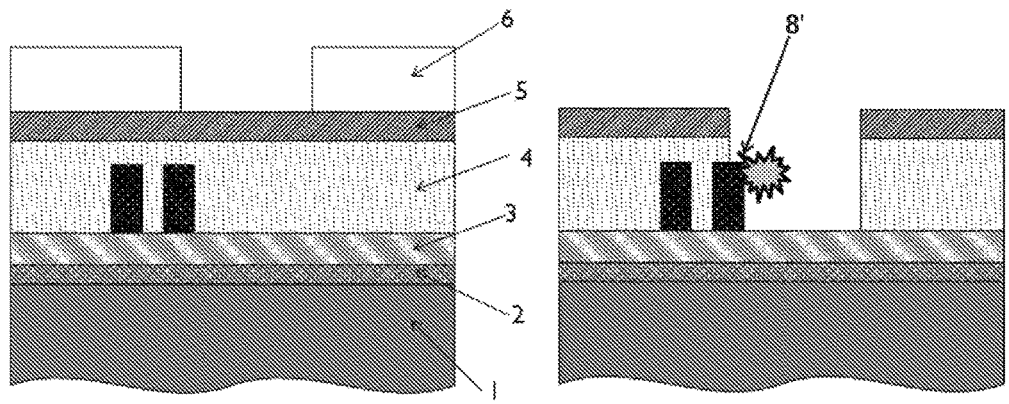
FIG. 3 illustrates a problem occurring when performing double DSA patterning.
Figure 4:
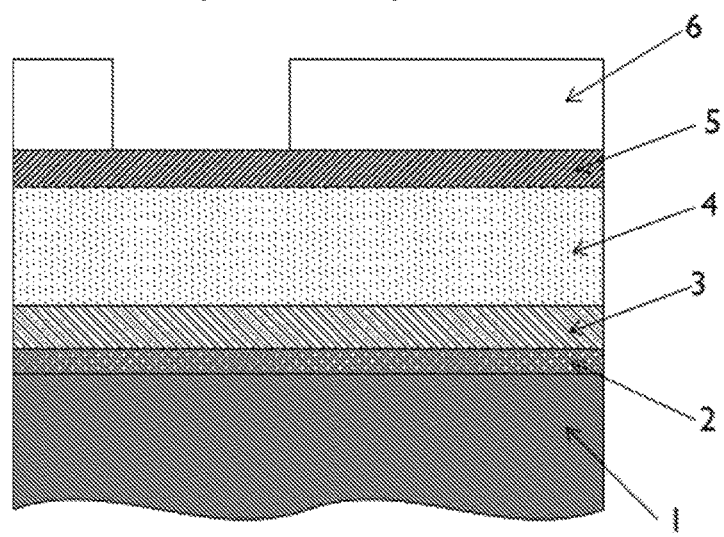
FIG. 4 illustrates a step of a first process flow, according to example embodiments.

As illustrated in FIG. 3, in an alternative DSA patterning flow, the component of the BCP material which was removed in the flow described in relation with FIG. 2 is not removed but is submitted to a SIS process. The other component is then removed, such that pillar structures 8' are formed which can later be used to pattern underlying layers. Also here, the pillar structures 8' of the first DSA/SIS process may be present in regions where the second DSA process template hole 8 is provided, again jeopardizing the BCP filling process and/or phase separation process.

In embodiments of the present disclosure, a method is disclosed for patterning a substrate 1,2, comprising applying a first DSA patterning process defining a first patterned layer on top of the substrate 1,2, the pattern of the first patterned layer intended to be transferred into the substrate;

applying a planarizing layer 4' on top of the first patterned layer;

applying a second DSA patterning process defining a second patterned layer on top of the planarizing layer 4', thereby not patterning the planarizing layer 4', the pattern of the second patterned layer intended to be transferred into the substrate, and the projections of the pattern of the second patterned layer and the pattern of the first patterned layer on the substrate having no overlap; and thereafter, transferring the patterns defined by the first patterned layer and the second patterned layer into the substrate 1,2.

FIGS. 4 to 21 illustrate a process flow according to a first embodiment of the present disclosure. A substrate 1, 2 is provided comprising a hard mask layer (for instance an organic, inorganic or metal hard mask, for instance comprising TiN) on top of a target substrate (e.g., silicon substrate or wafer).

Figure 5:
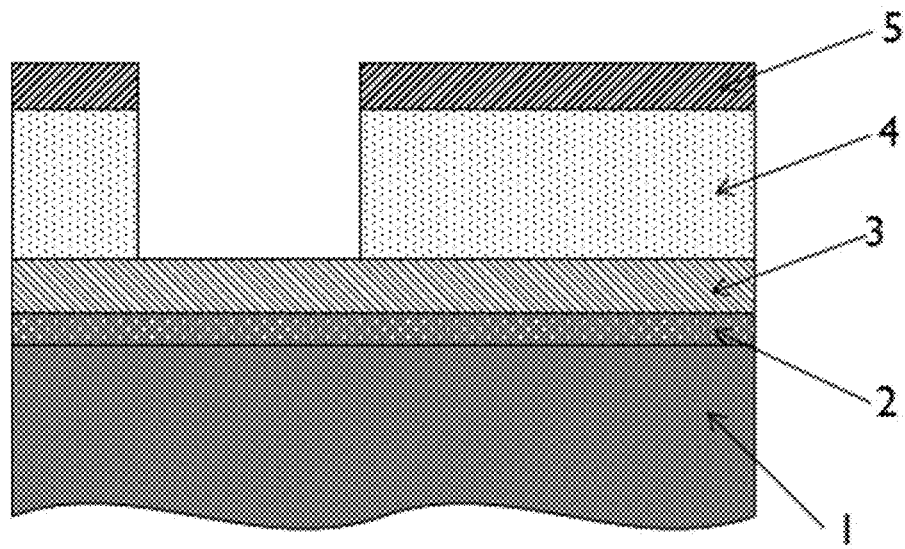
FIG. 5 illustrates a step of a first process flow, according to example embodiments.
Figure 6:
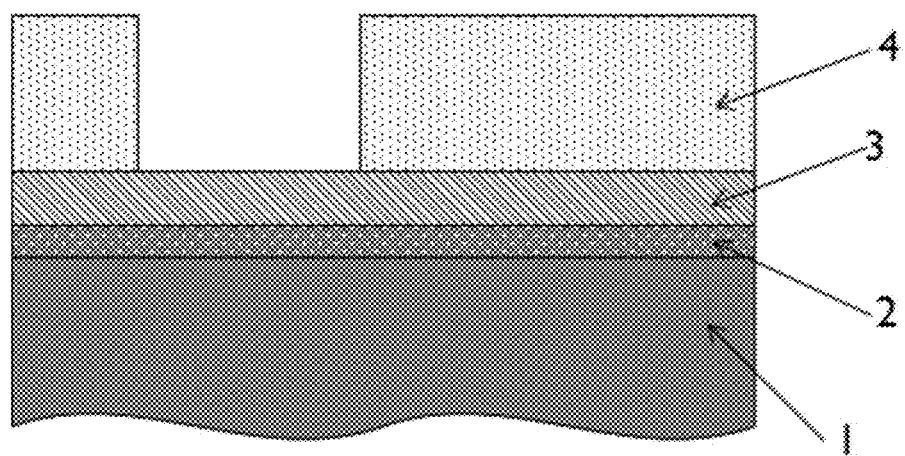
FIG. 6 illustrates a step of a first process flow, according to example embodiments.
Figure 7:
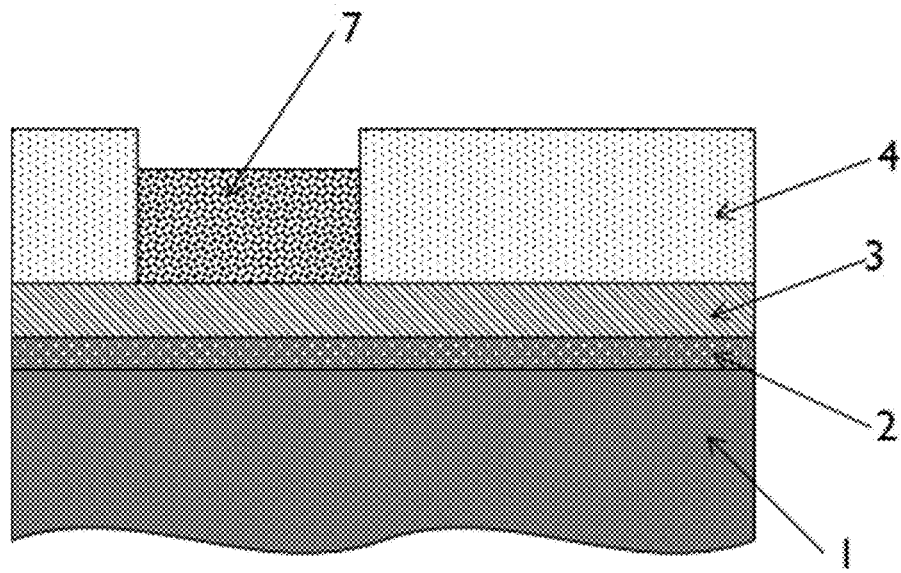
FIG. 7 illustrates a step of a first process flow, according to example embodiments.
Figure 8:
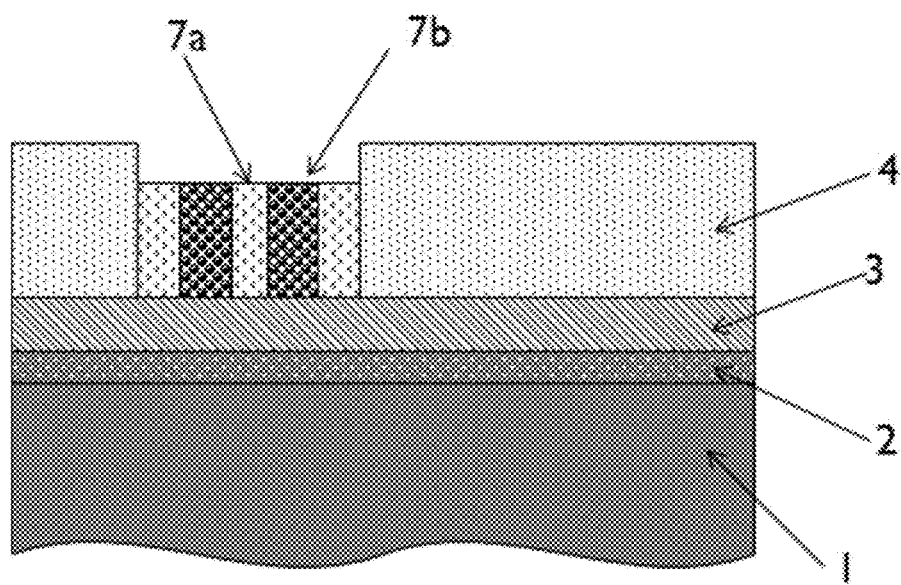
FIG. 8 illustrates a step of a first process flow, according to example embodiments.
Figure 9:
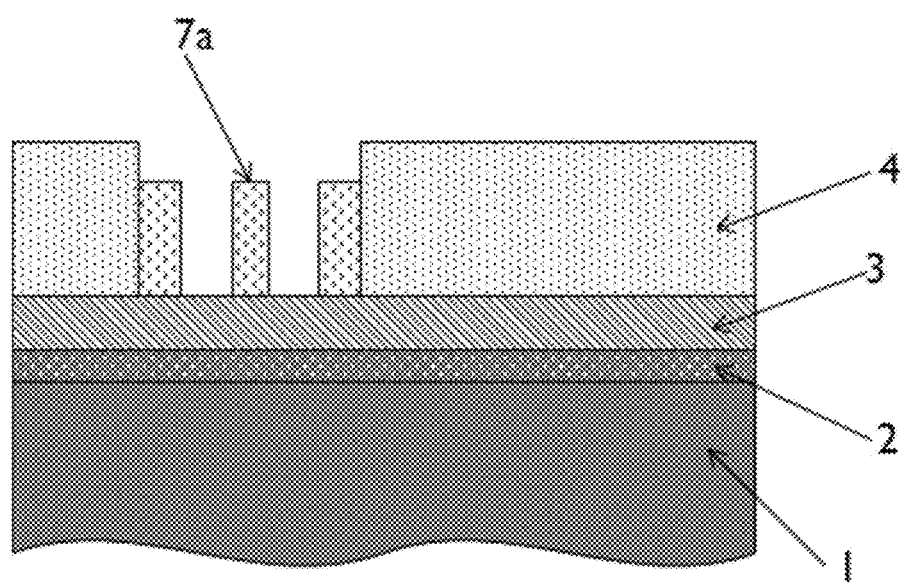
FIG. 9 illustrates a step of a first process flow, according to example embodiments.

A first dielectric hard mask layer 3 is provided on the hard mask layer 2, for instance a SiN layer. A first planarizing layer 4, 5, e.g., a SoC/SoG bilayer, is provided on the first dielectric hard mask layer 3. A first by lithography patterned photoresist layer 6 is provided on the first planarizing layer 4, 5, the first patterned photoresist layer comprising openings (See FIG. 4). The openings in the first patterned photoresist layer 6 are transferred into the first planarizing layer 4, 5 (FIG. 5). The SoG layer 5 is optionally removed. A neutral brush layer and a first BCP material 7, e.g., PS-b-PMMA, are applied in openings defined in the patterned first planarizing layer 4, (5) (FIG. 7). Phase separation of the first BCP material 7 is induced in the openings in the patterned first planarizing layer 4, 5, resulting in cylindrical domains of a first component 7b; e.g., PMMA) of the first BCP material being surrounded by a complementary domain of a second component (7a; e.g., PS) of the first BCP material (FIG. 8). The first component 7b is selectively removed thereby defining openings in the second component 7a of the first BCP material in the openings in the patterned first planarizing layer 4, 5 (FIG. 9).

Figure 10:
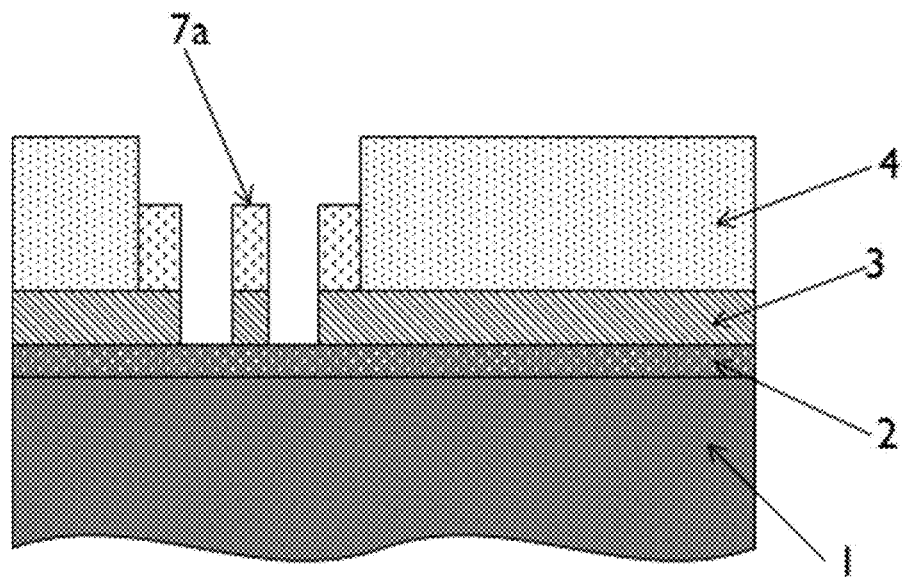
FIG. 10 illustrates a step of a first process flow, according to example embodiments.
Figure 11:
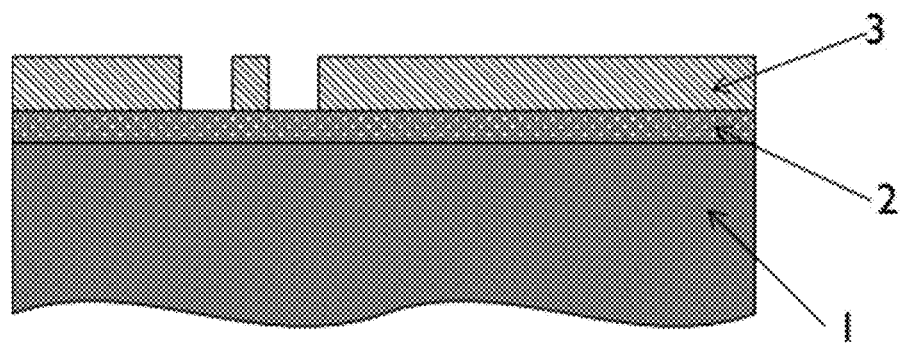
FIG. 11 illustrates a step of a first process flow, according to example embodiments.

The openings in the second component 7a of the first BCP material are transferred in the first dielectric hard mask layer 3, the latter corresponding to the first patterned layer (FIG. 10). The first planarizing layer 4,5 and the second component of the first BCP material 7a are selectively removed (FIG. 11).

A (intermediate) planarizing layer 4' is now applied on top of the first patterned layer. A second DSA patterning process is then applied on the planarizing layer 4'. A second dielectric hard mask layer 3' is provided on the planarizing layer 4' and a second planarizing layer 4", 5' is provided on the second dielectric hard mask layer 3'.

Figure 12:
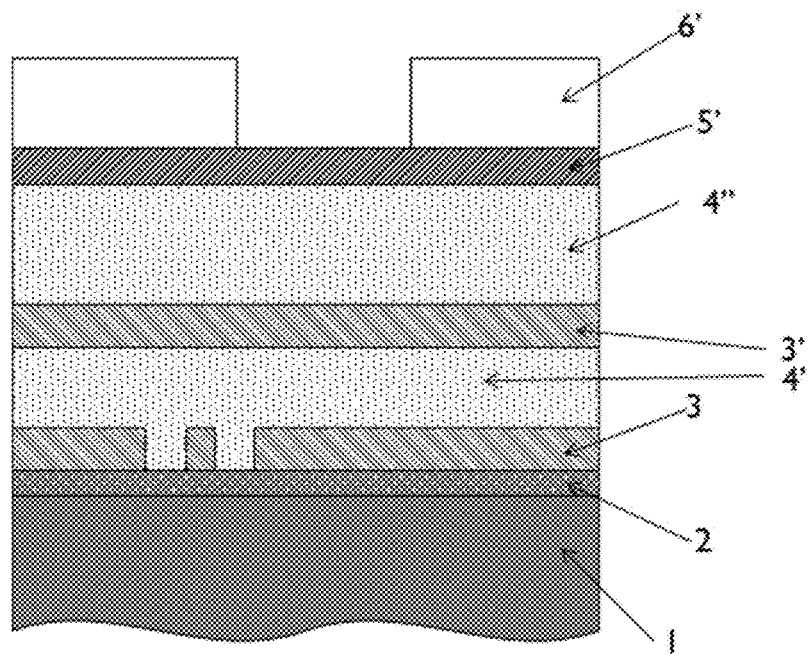
FIG. 12 illustrates a step of a first process flow, according to example embodiments.

A second patterned photoresist layer 6' is applied on the second planarizing layer 4", 5', the second patterned photoresist layer comprising openings (FIG. 12).

Figure 13:
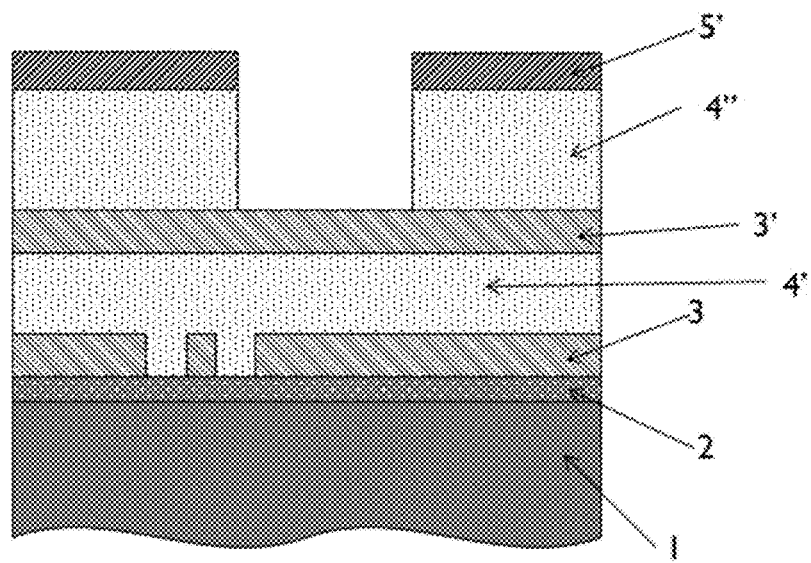
FIG. 13 illustrates a step of a first process flow, according to example embodiments.
Figure 14:
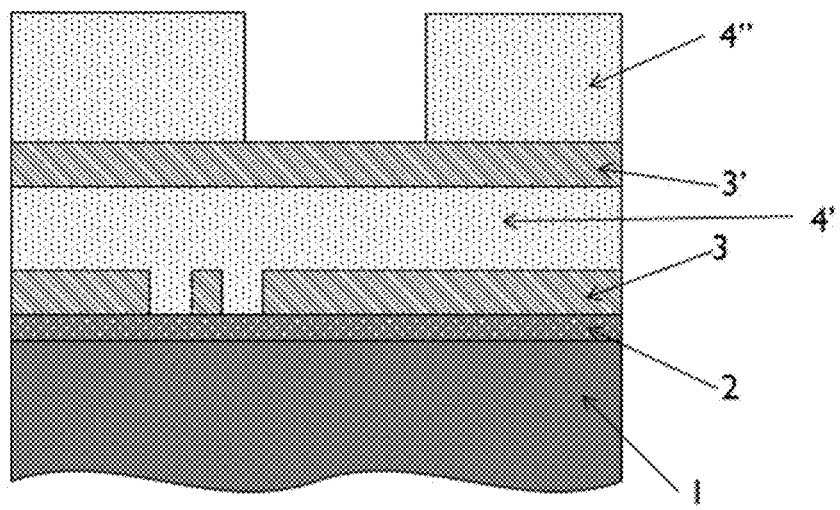
FIG. 14 illustrates a step of a first process flow, according to example embodiments.

The openings in the second patterned photoresist layer 6' are transferred into the second planarizing layer 4", 5' (FIG. 13). The SoG layer is optionally removed (FIG. 14).

Figure 15:
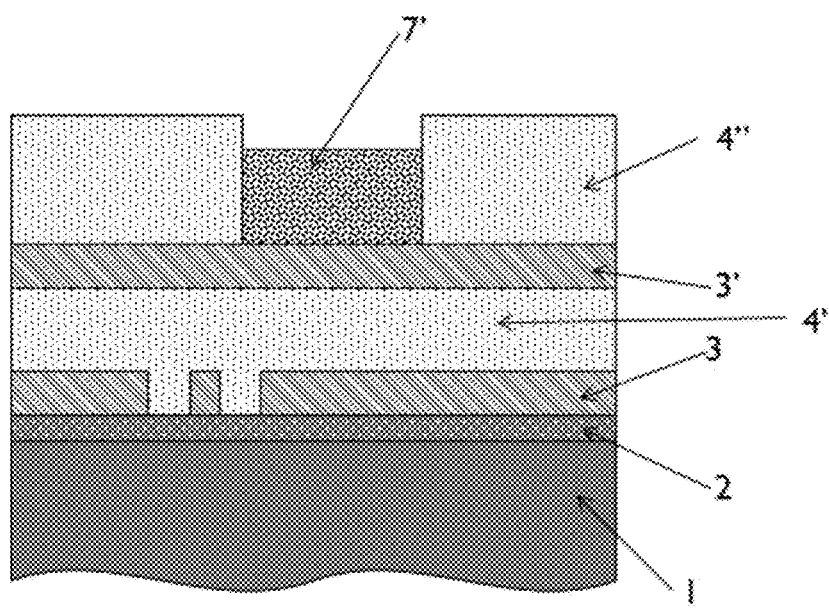
FIG. 15 illustrates a step of a first process flow, according to example embodiments.
Figure 16:
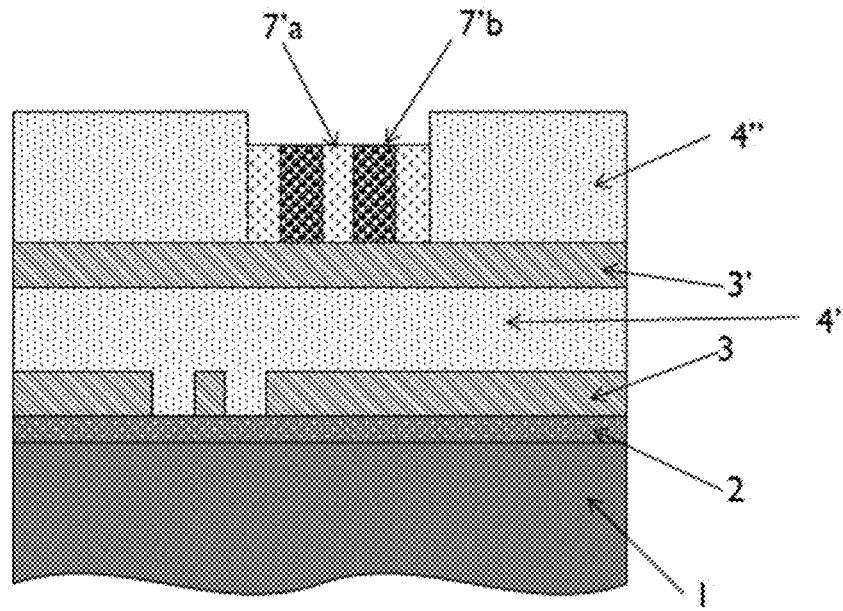
FIG. 16 illustrates a step of a first process flow, according to example embodiments.
Figure 17:
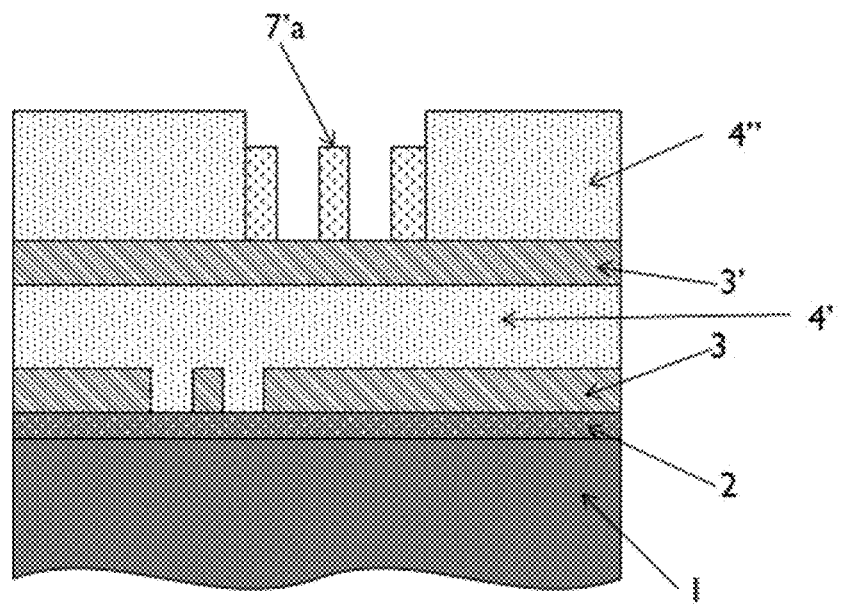
FIG. 17 illustrates a step of a first process flow, according to example embodiments.
Figure 18:
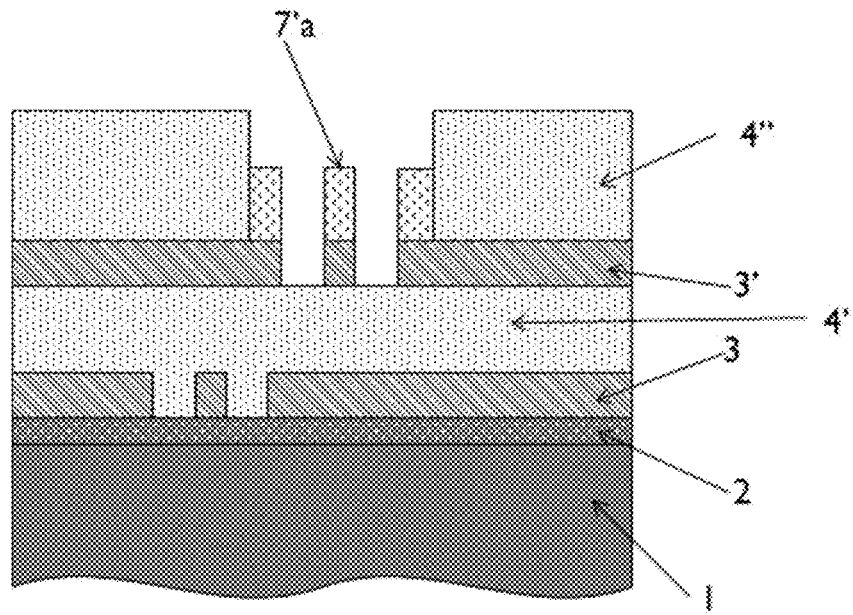
FIG. 18 illustrates a step of a first process flow, according to example embodiments.
Figure 19:
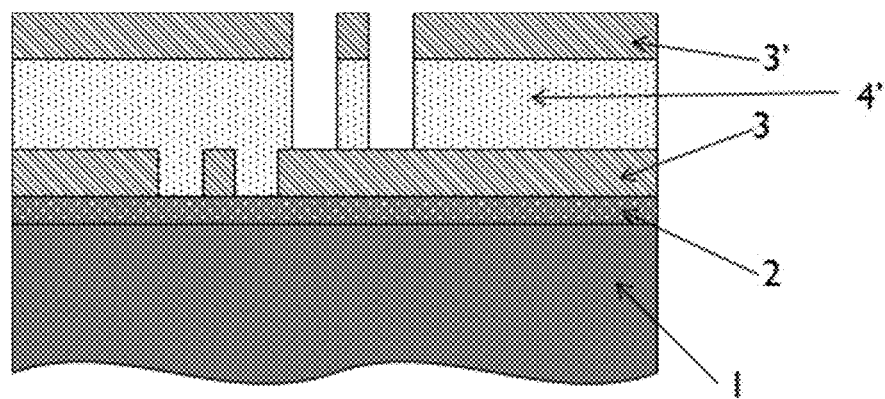
FIG. 19 illustrates a step of a first process flow, according to example embodiments.
Figure 20:
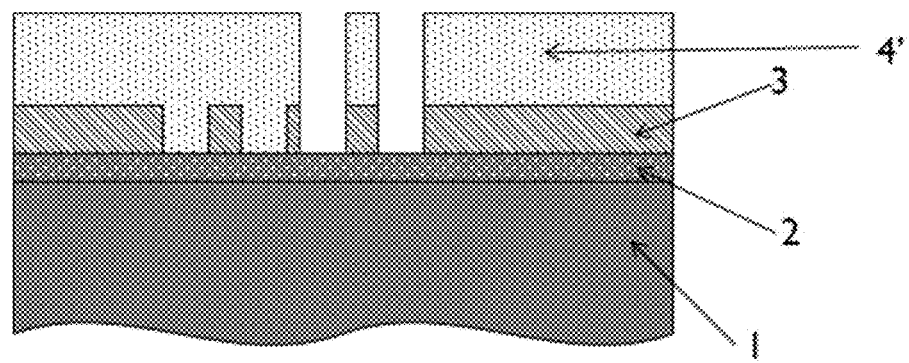
FIG. 20 illustrates a step of a first process flow, according to example embodiments.
Figure 21:
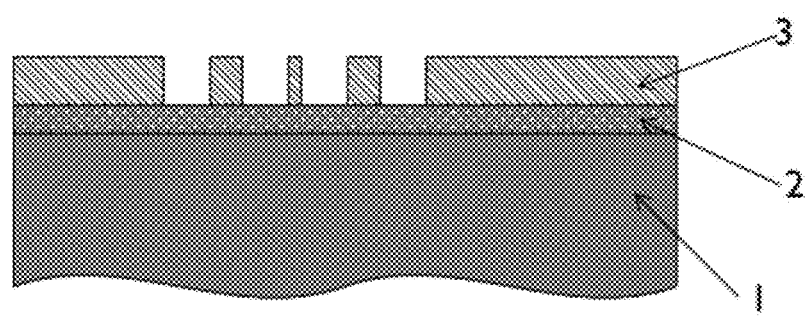
FIG. 21 illustrates a step of a first process flow, according to example embodiments.
Figure 22:
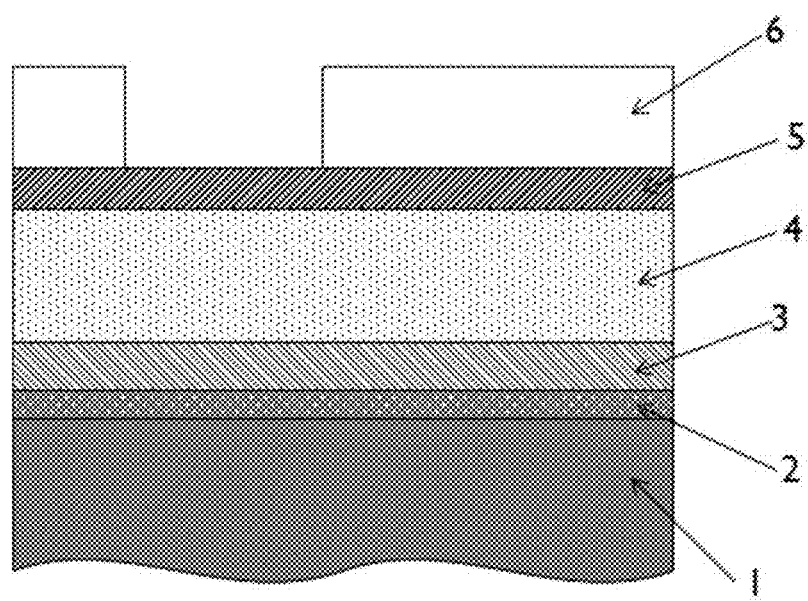
FIG. 22 illustrates a step of a second process flow, according to example embodiments.
Figure 23:
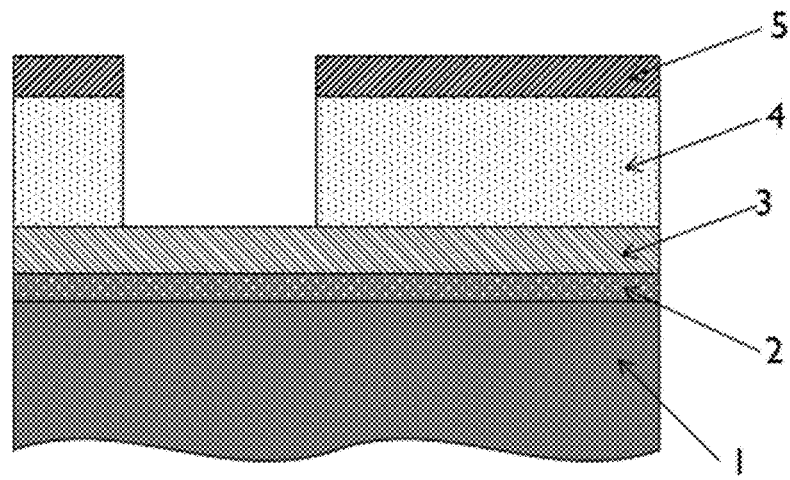
FIG. 23 illustrates a step of a second process flow, according to example embodiments.
Figure 24:
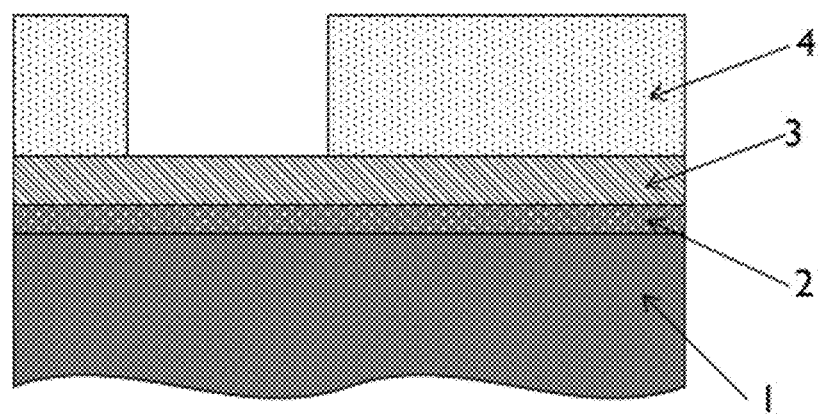
FIG. 24 illustrates a step of a second process flow, according to example embodiments.
Figure 25:
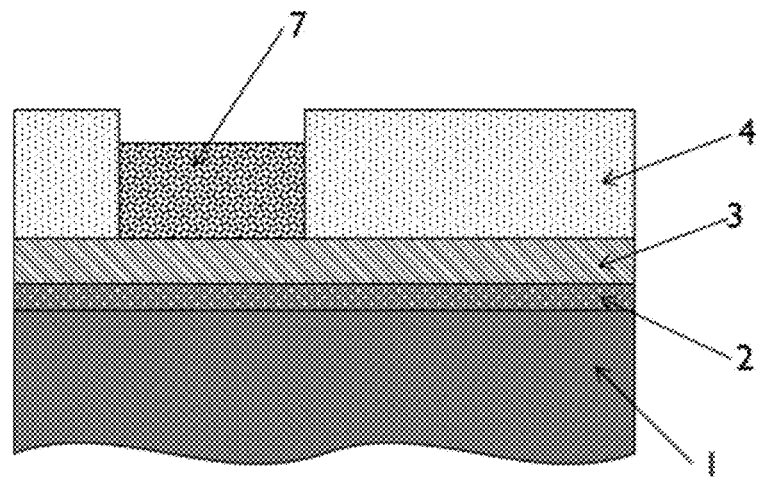
FIG. 25 illustrates a step of a second process flow, according to example embodiments.
Figure 26:
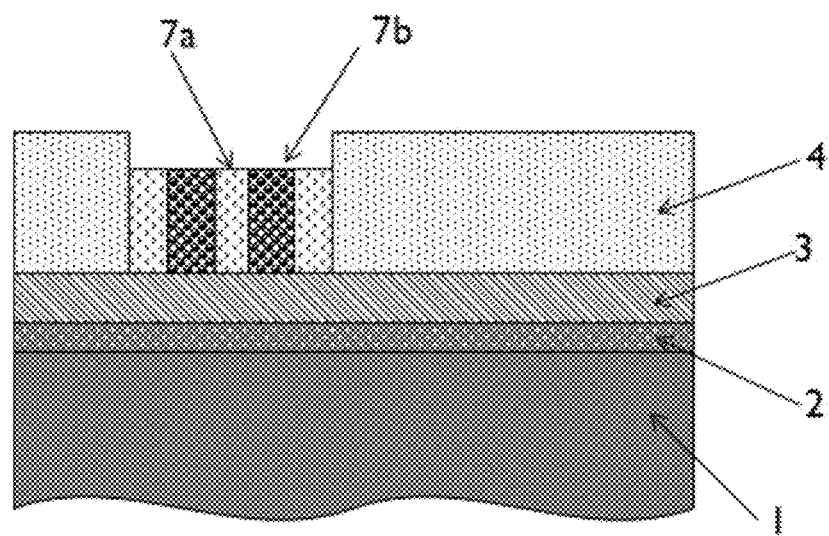
FIG. 26 illustrates a step of a second process flow, according to example embodiments.

A neutral brush layer and a second BCP material 7' (for instance the same as the first BSP material, e.g., PS-b-PMMA) is provided in openings defined in the patterned second planarizing layer 4", 5' (FIG. 15). Phase separation of the second BCP material 7' is induced in the openings in the patterned second planarizing layer 4", 5', resulting in cylindrical domains of a first component 7'b of the BCP material being surrounded by a complementary domain of a second component 7'a of the second BCP material (FIG. 16). The first component (7'b; e.g., PMMA) is selectively removed thereby defining openings in the second component (7'a; e.g., PS) of the second BCP material in the openings in the patterned second planarizing layer 4",5' (FIG. 17). The openings in the second component 7'a of the second BCP material are transferred in the second dielectric hard mask layer 3', the latter corresponding to the second patterned layer (FIG. 18). The second planarizing layer 4",5' and the second component of the second BCP material 7'a are selectively removed, while transferring the openings in the second dielectric hard mask layer 3' into the planarizing layer 4' (FIG. 19). The openings in the planarizing layer 4' are transferred into the first dielectric hard mask layer 3 (FIG. 20), followed by transferring the resulting pattern of the patterned first dielectric hard mask layer 3 into the substrate (FIG. 21). At the same time the second dielectric hard mask layer 3' can be removed.

FIGS. 22 to 43 illustrate a process flow according to a second embodiment of the present disclosure.

Figure 27:
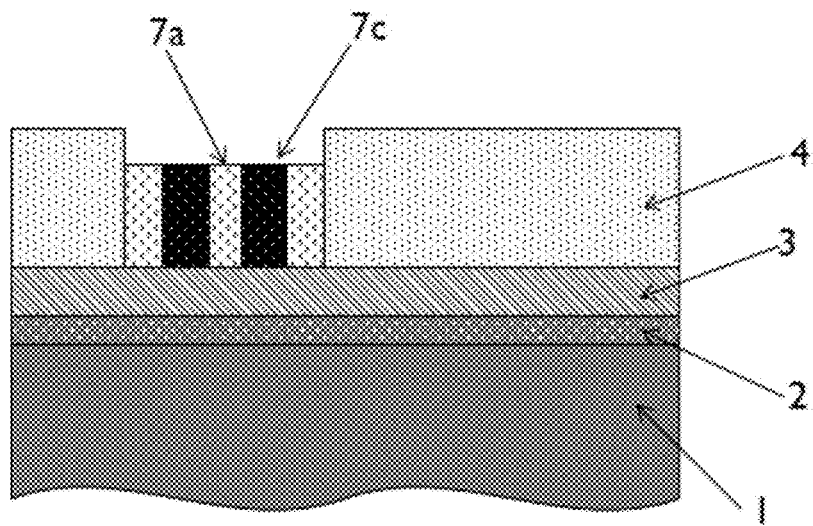
FIG. 27 illustrates a step of a second process flow, according to example embodiments.

The process illustrated in FIGS. 22 to 26 is identical to the process described in relation with FIGS. 4 to 8. Then, a sequential infiltration synthesis process is applied to selectively transform the cylindrical domains of the first component 7b into first metallic pillar structures 7c (for instance into $AlO_x$ pillars) (FIG. 27).

Figure 28:
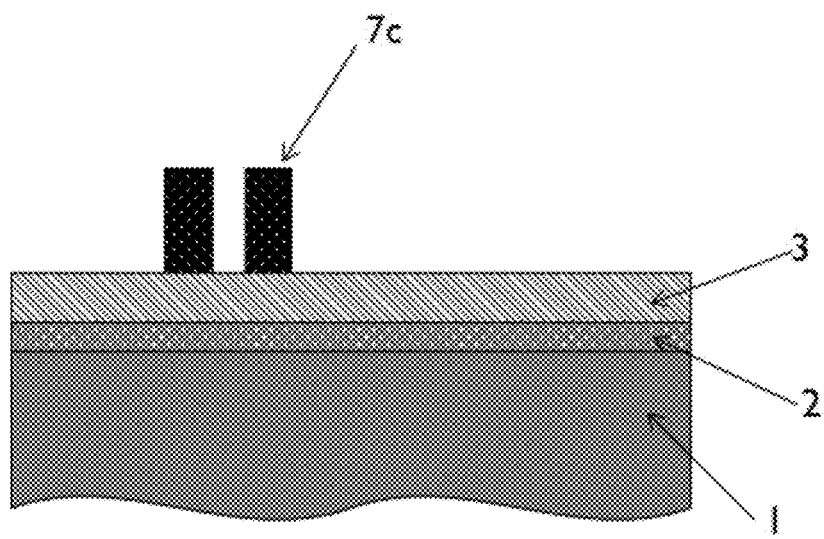
FIG. 28 illustrates a step of a second process flow, according to example embodiments.

The second component 7a and the first planarizing layer 4,5 are selectively removed, the pattern of first metallic pillar structures 7c corresponding to the first patterned layer (FIG. 28)

Figure 29:
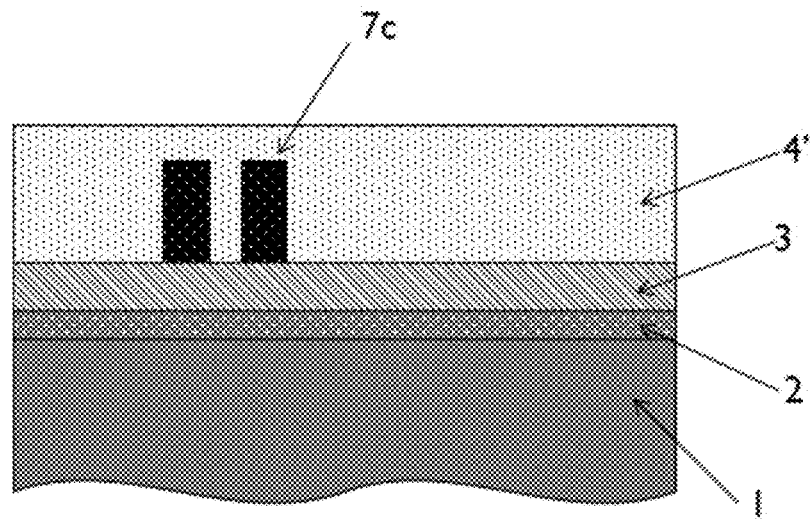
FIG. 29 illustrates a step of a second process flow, according to example embodiments.

A (intermediate) planarizing layer 4' is now applied on top of the first patterned layer (FIG. 29).

Figure 30:
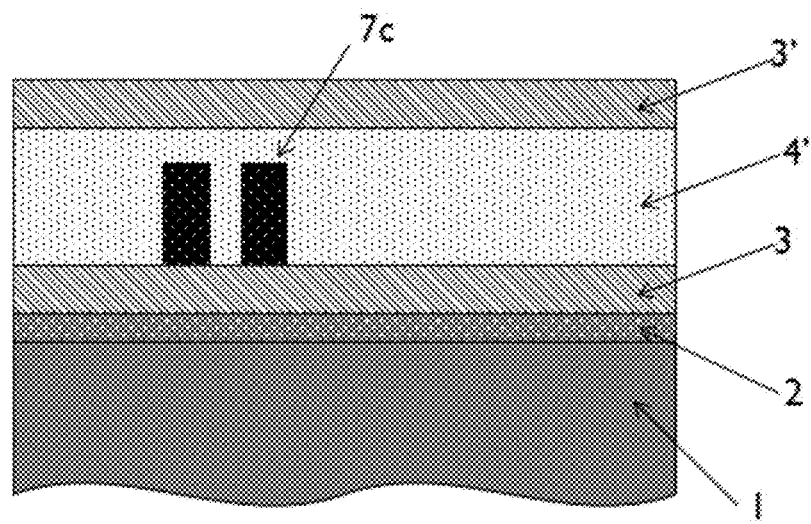
FIG. 30 illustrates a step of a second process flow, according to example embodiments.
Figure 31:
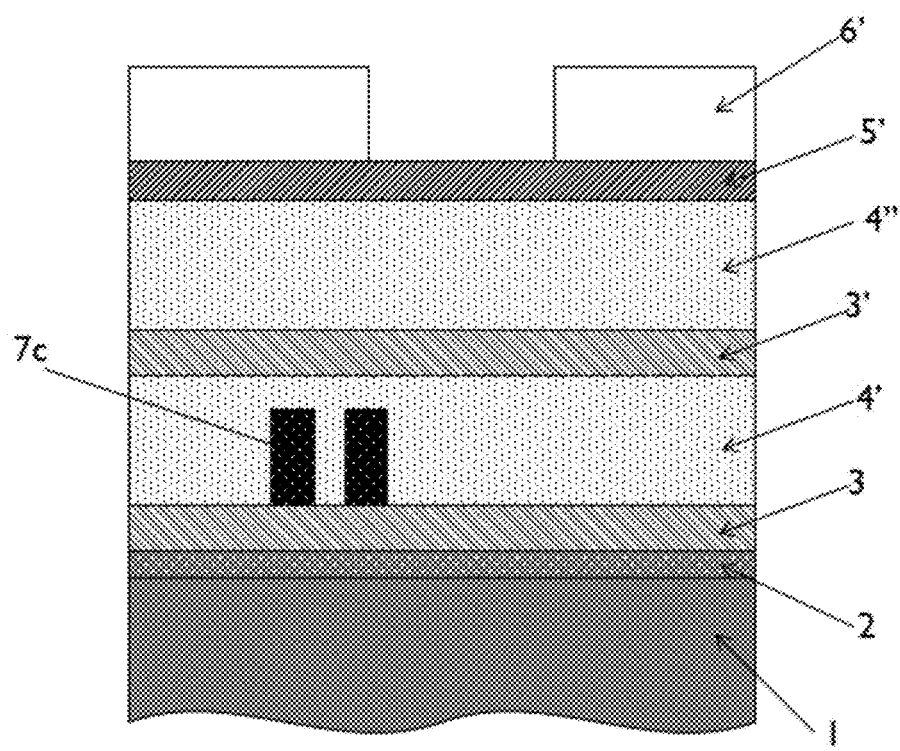
FIG. 31 illustrates a step of a second process flow, according to example embodiments.

A second dielectric hard mask layer 3' is provided on the planarizing layer 4', followed by providing a second planarizing layer 4",5' on the dielectric hard mask layer 3', and by providing a second patterned photoresist layer 6' on the planarizing layer 4",5', the second patterned photoresist layer 5' comprising openings (FIG. 30).

Figure 32:
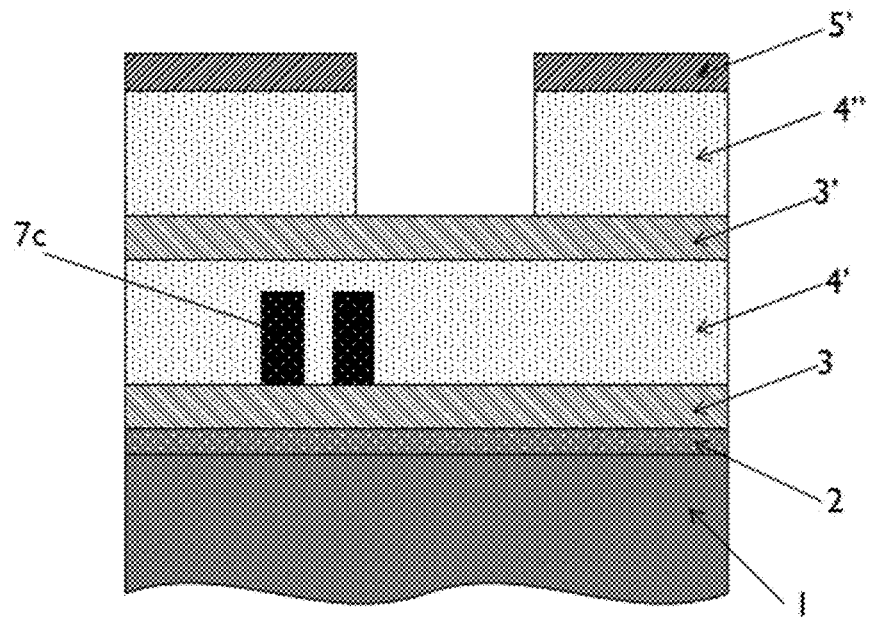
FIG. 32 illustrates a step of a second process flow, according to example embodiments.
Figure 33:
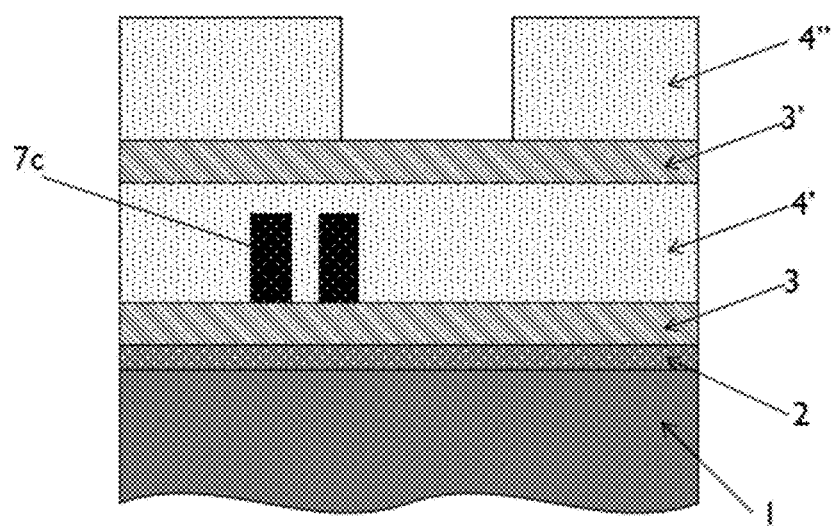
FIG. 33 illustrates a step of a second process flow, according to example embodiments.
Figure 34:
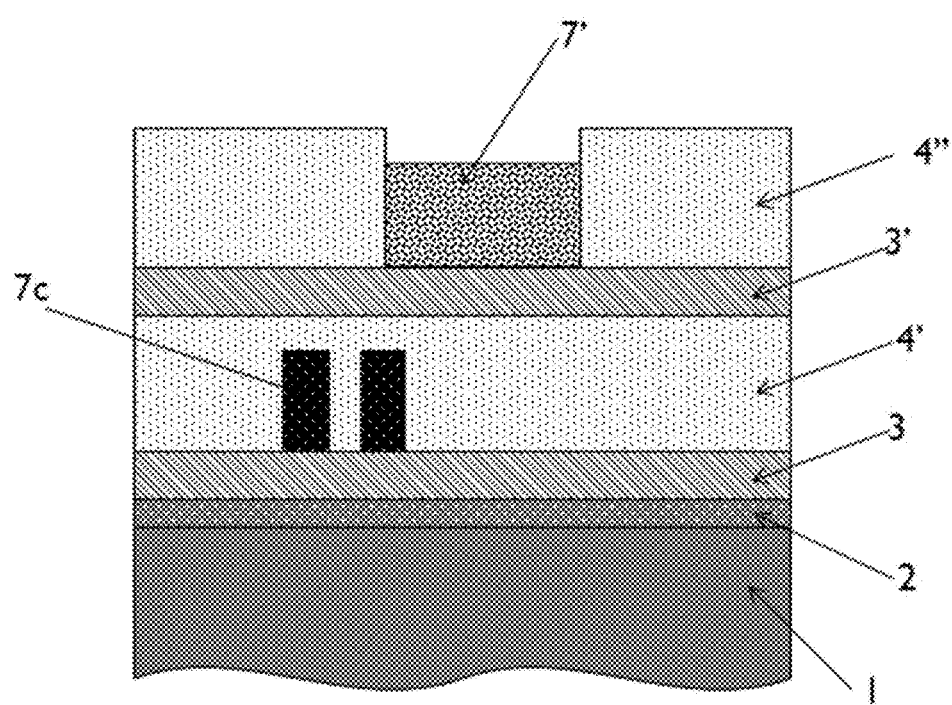
FIG. 34 illustrates a step of a second process flow, according to example embodiments.

The openings in the second patterned photoresist layer (6') are transferred into the second planarizing layer 4",5' (FIG. 32). Optionally the SoG layer 5 is selectively removed (FIG. 33). A neutral brush layer and a second BCP material 7' are applied in openings defined in the patterned second planarizing layer 4",5' (FIG. 34).

Figure 35:
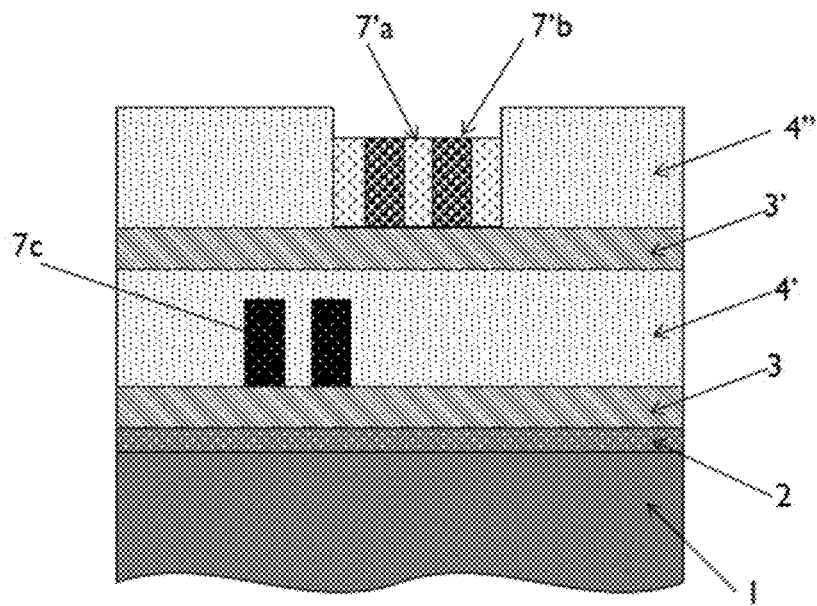
FIG. 35 illustrates a step of a second process flow, according to example embodiments.

Phase separation of the second BCP material 7' is induced in the openings in the patterned second planarizing layer 4",5', resulting in cylindrical domains of a first component 7'b of the second BCP material being surrounded by a complementary domain of a second component 7'a of the second BCP material (FIG. 35).

Figure 36:
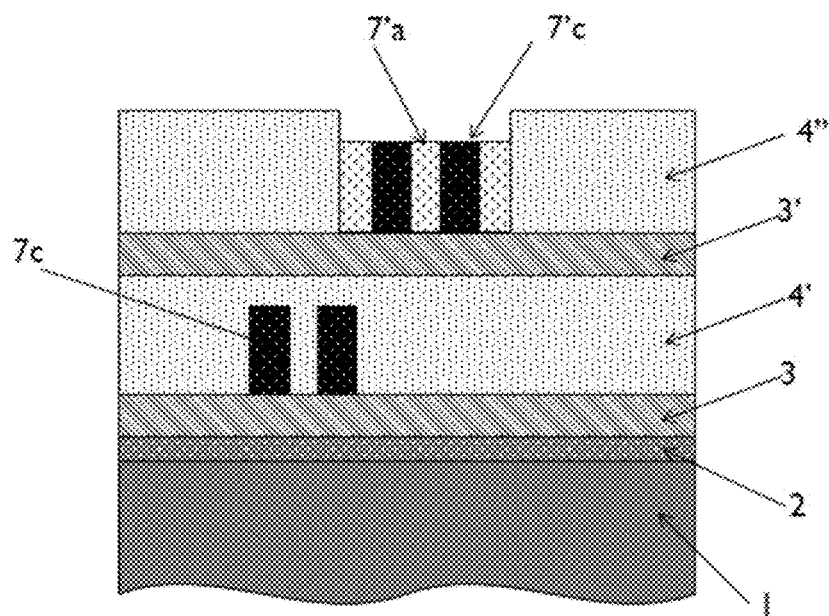
FIG. 36 illustrates a step of a second process flow, according to example embodiments.

A sequential infiltration synthesis process is performed to selectively transform the cylindrical domains of the first component 7'b into second metallic pillar structures 7'c (FIG. 36).

Figure 37:
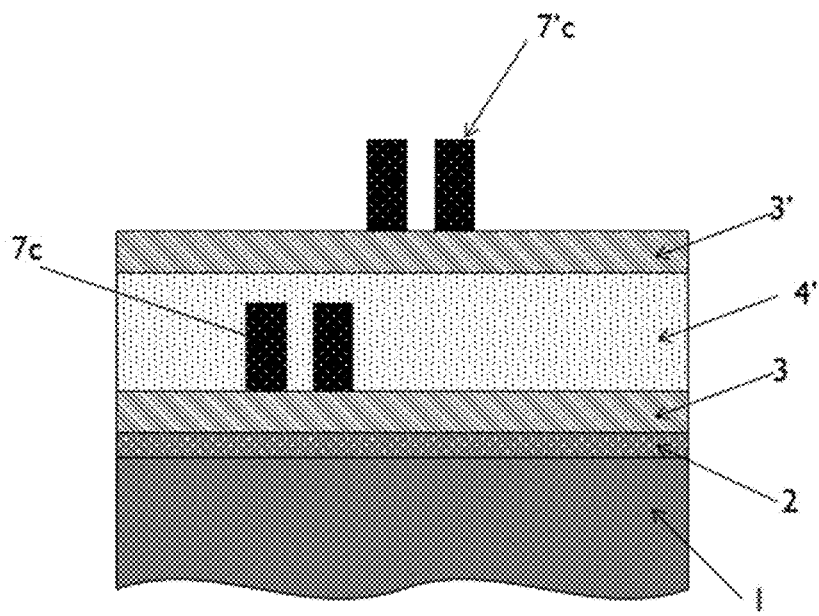
FIG. 37 illustrates a step of a second process flow, according to example embodiments.
Figure 38:
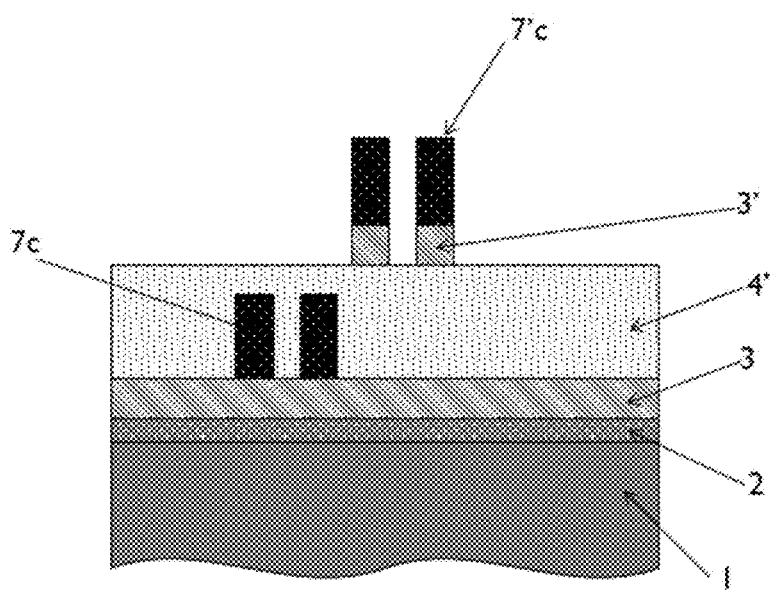
FIG. 38 illustrates a step of a second process flow, according to example embodiments.
Figure 39:
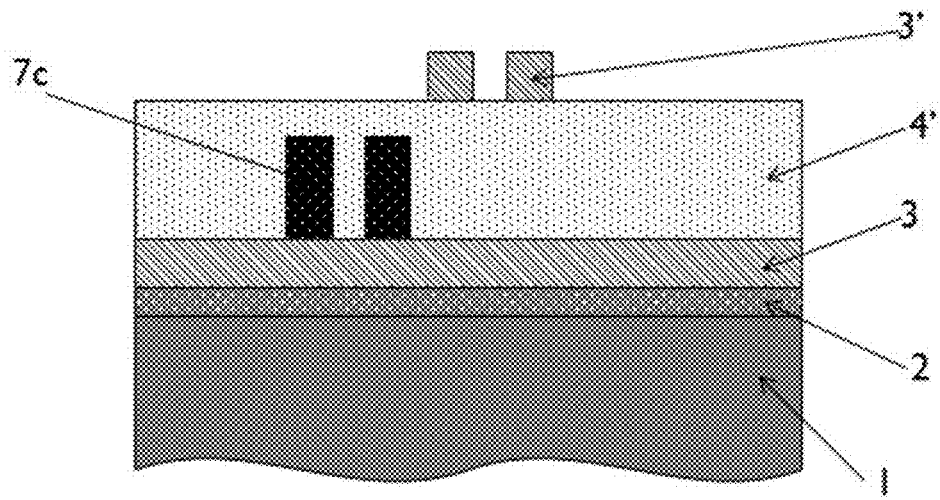
FIG. 39 illustrates a step of a second process flow, according to example embodiments.

The second component 7'a and the planarizing layer 4",5' are selectively removed; the pattern of metallic pillar structures 7'c defining a second patterned layer on top of the planarizing layer 4' (FIG. 37).

Figure 40:
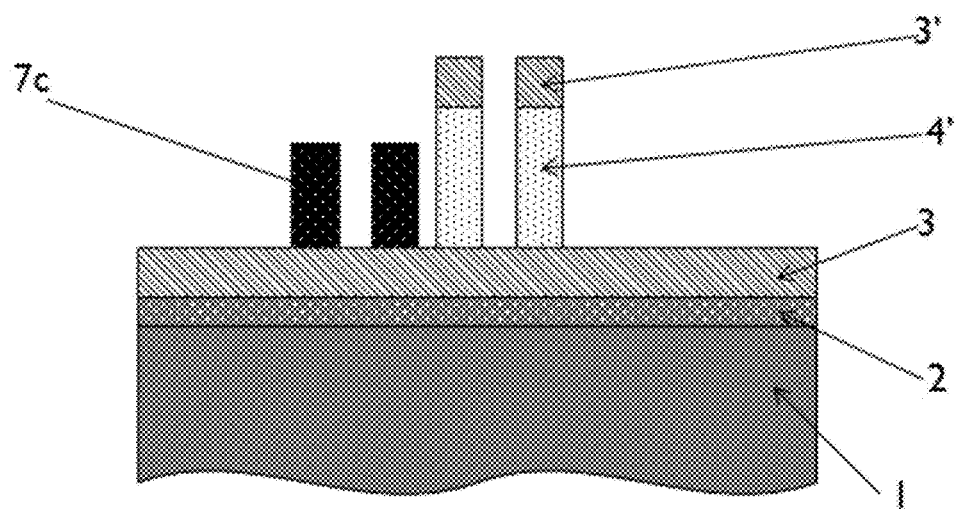
FIG. 40 illustrates a step of a second process flow, according to example embodiments.
Figure 41:
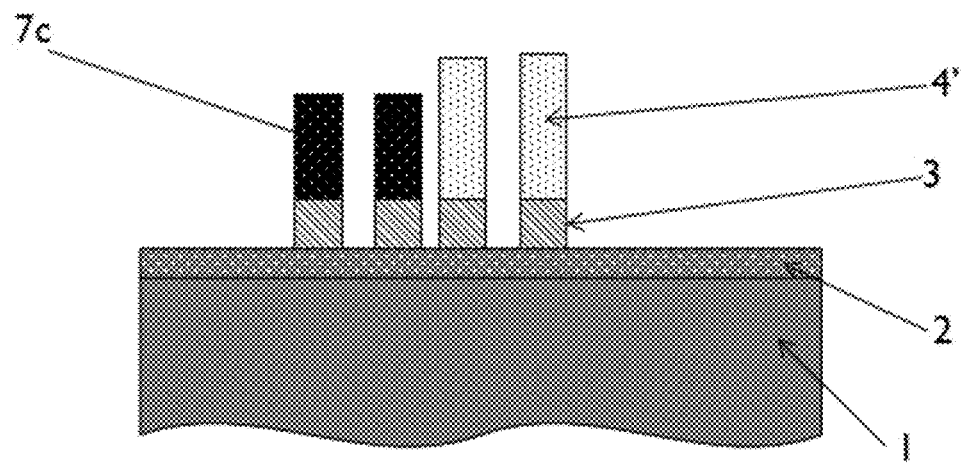
FIG. 41 illustrates a step of a second process flow, according to example embodiments.
Figure 42:
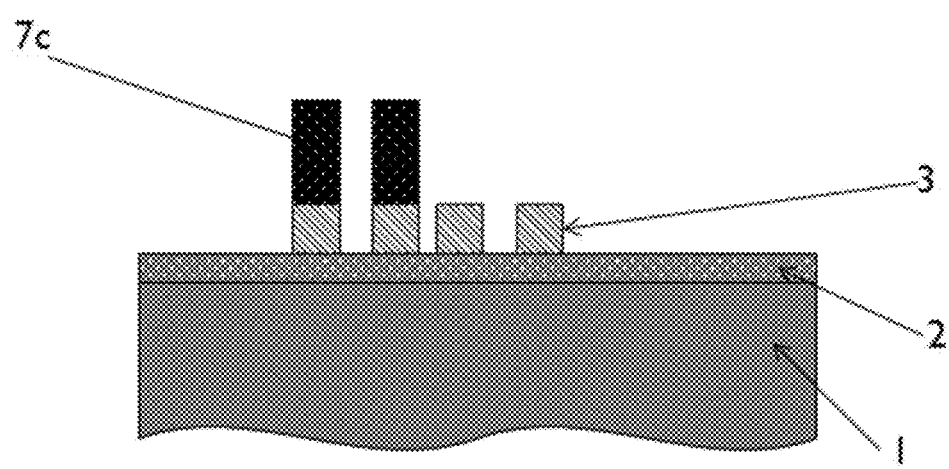
FIG. 42 illustrates a step of a second process flow, according to example embodiments.
Figure 43:
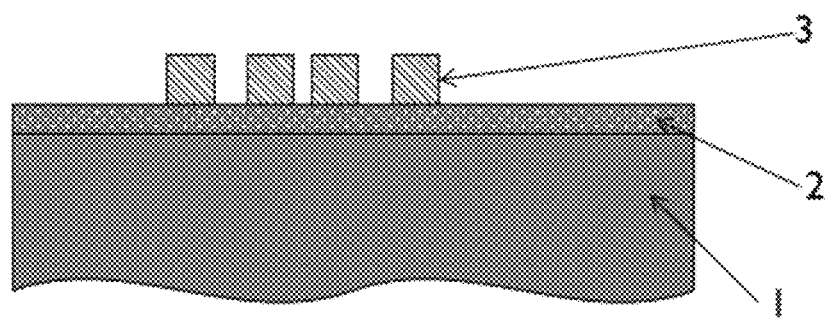
FIG. 43 illustrates a step of a second process flow, according to example embodiments.

The pattern of second metallic pillar structures 7'c is transferred into the second dielectric hard mask layer 3' and into the planarizing layer 4' (FIG. 40). The patterns of first metallic structures 7c and the patterned planarizing layer 4' are transferred into the first dielectric hard mask layer 3 (FIG. 41).

The metallic pillar structures 7c (FIG. 43) and the planarizing layer 4' (FIG. 42) are removed, followed by transferring the pattern of the patterned first dielectric hard mask layer 3 into the substrate 1,2.

The foregoing description details certain embodiments of the disclosure. It will be appreciated, however, that no matter how detailed the foregoing appears in text, the disclosure may be practiced in many ways.

While the above detailed description has shown, described, and pointed out novel features of the disclosure as applied to various embodiments, it will be understood that various omissions, substitutions, and changes in the form and details of the device or process illustrated may be made without departing from the disclosure.

What is claimed is:

1. A method for patterning a substrate, comprising:
    applying a first directed self-assembly (DSA) patterning process defining a first patterned layer on top of the substrate, wherein a pattern of the first patterned layer is to be transferred into the substrate;
    applying a planarizing layer on top of the first patterned layer;
    applying a second DSA patterning process defining a second patterned layer on top of the planarizing layer, thereby not patterning the planarizing layer, wherein a pattern of the second patterned layer is to be transferred into the substrate, and wherein projections of the pattern of the second patterned layer and the pattern of the first patterned layer on the substrate have no overlap; and
    transferring the patterns defined by the first patterned layer and the second patterned layer into the substrate.

2. The method according to claim 1, wherein the substrate comprises a hard mask layer on top of a target substrate, and wherein applying the first DSA patterning process comprises:
    providing a first dielectric hard mask layer on the hard mask layer;
    providing a first planarizing layer on the first dielectric hard mask layer;
    providing a first patterned photoresist layer on the first planarizing layer, wherein the first patterned photoresist layer comprises openings;
    transferring the openings in the first patterned photoresist layer into the first planarizing layer;
    applying a first block copolymer (BCP) material in openings defined in the first planarizing layer;
    inducing phase separation of the first BCP material in the openings in the first planarizing layer, resulting in cylindrical domains of a first component of the first BCP material being surrounded by a complementary domain of a second component of the first BCP material;
    selectively removing the first component thereby defining openings in the second component of the first BCP material;
    transferring the openings in the second component of the first BCP material in the first dielectric hard mask layer, wherein the first dielectric hard mask layer corresponds to the first patterned layer; and
    selectively removing the first planarizing layer and the second component of the first BCP material.

3. The method according to claim 2, wherein the first BCP material is (Polystyrene)-b-PMMA (poly methyl methacrylate) (PS-b-PMMA).

4. The method according to claim 2, wherein the hard mask layer comprises titanium nitride (TiN).

5. The method according to claim 2, wherein the first dielectric hard mask layer comprises silicon nitride (SiN).

6. The method according to claim 5, wherein the first dielectric hard mask layer is deposited at a low temperature by an atomic layer deposition (ALD) process.

7. The method according to claim 2, wherein applying the second DSA patterning process comprises:
- providing a second dielectric hard mask layer on the planarizing layer;
- providing a second planarizing layer on the second dielectric hard mask layer;
- providing a second patterned photoresist layer on the second planarizing layer, wherein the second patterned photoresist layer comprises openings;
- transferring the openings in the second patterned photoresist layer into the second planarizing layer;
- applying a second block copolymer (BCP) material in openings defined in the second planarizing layer;
- inducing phase separation of the second BCP material in the openings in the second planarizing layer, resulting in cylindrical domains of a first component of the second BCP material being surrounded by a complementary domain of a second component of the second BCP material;
- selectively removing the first component thereby defining openings in the second component of the second BCP material;
- transferring the openings in the second component of the second BCP material in the second dielectric hard mask layer, wherein the second dielectric hard mask layer corresponds to the second patterned layer; and
- selectively removing the second planarizing layer and the second component of the second BCP material.

8. The method according to claim 7, further comprising:
- transferring the openings in the second dielectric hard mask layer into the first dielectric hard mask layer; and
- transferring a resulting pattern associated with the first dielectric hard mask layer into the substrate.

9. The method according to claim 1, wherein the substrate comprises a hard mask layer on top of a target substrate, and wherein applying the first DSA patterning process comprises:
- providing a first dielectric hard mask layer on the hard mask layer;
- providing a first planarizing layer on the first dielectric hard mask layer;
- providing a first patterned photoresist layer on the first planarizing layer, wherein the first patterned photoresist layer comprises openings;
- transferring the openings in the first patterned photoresist layer into the first planarizing layer;
- applying a first block copolymer (BCP) material in openings defined in the first planarizing layer;
- inducing phase separation of the first BCP material in the openings in the first planarizing layer, resulting in cylindrical domains of a first component of the first BCP material being surrounded by a complementary domain of a second component of the first BCP material;
- performing a sequential infiltration synthesis process to selectively transform the cylindrical domains of the first component of the first BCP material into first metallic pillar structures; and
- selectively removing the second component of the first BCP material and the first planarizing layer, wherein a pattern of the first metallic pillar structures corresponds to the first patterned layer.

10. The method according to claim 9, wherein applying the second DSA patterning process comprises:
- providing a second dielectric hard mask layer on the planarizing layer;
- providing a second planarizing layer on the second dielectric hard mask layer;
- providing a second patterned photoresist layer on the second planarizing layer, wherein the second patterned photoresist layer comprises openings;
- transferring the openings in the second patterned photoresist layer into the second planarizing layer;
- applying a second block copolymer (BCP) material in openings defined in the second planarizing layer;
- inducing phase separation of the second BCP material in the openings in the second planarizing layer, resulting in cylindrical domains of a first component of the second BCP material being surrounded by a complementary domain of a second component of the second BCP material;
- performing a sequential infiltration synthesis process to selectively transform the cylindrical domains of the first component of the second BCP material into second metallic pillar structures; and
- selectively removing the second component of the second BCP material and the second planarizing layer, wherein a pattern of the second metallic pillar structures corresponds to the second patterned layer.

11. The method according to claim 10, further comprising:
- transferring the pattern of the second metallic pillar structures into the second dielectric hard mask layer and into the planarizing layer; and
- transferring the pattern of the first metallic pillar structures and the planarizing layer into the first dielectric hard mask layer.

12. The method according to claim 11, further comprising:
- removing the metallic pillar structures and the planarizing layer; and
- transferring a pattern of the first dielectric hard mask layer into the substrate.

* * * * *